(12) United States Patent
Maurer et al.

(10) Patent No.: US 6,281,031 B1
(45) Date of Patent: Aug. 28, 2001

(54) METHOD OF SEVERING A SEMICONDUCTOR WAFER

(75) Inventors: Josef Maurer, Pettendorf; Gisela Lang, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/250,866

(22) Filed: Feb. 16, 1999

Related U.S. Application Data

(63) Continuation of application No. PCT/DE97/01756, filed on Aug. 14, 1997.

(30) Foreign Application Priority Data

Aug. 19, 1996 (DE) .......................................... 196 32 815.2

(51) Int. Cl.[7] .................................................. H01L 21/00
(52) U.S. Cl. ............................................................ 438/33
(58) Field of Search ............................... 438/22, 33, 110, 438/113, 114, 462, 464, 465, 976

(56) References Cited

U.S. PATENT DOCUMENTS

| | | | |
|---|---|---|---|
| 4,476,620 | * 10/1984 | Ohki et al. ............................. | 438/33 |
| 4,731,344 | * 3/1988 | Canning et al. ....................... | 438/33 |
| 5,171,176 | 12/1992 | Cagan et al. . | |

FOREIGN PATENT DOCUMENTS

| | | |
|---|---|---|
| 0 661 737 A1 | 7/1995 | (EP) . |
| 61-180442 | 8/1986 | (JP) . |

OTHER PUBLICATIONS

Patent Abstracts of Japan No. 08–064557 A (Shoichi), dated Mar. 8, 1996.
Patent Abstracts of Japan No. 07–161665 A (Noburu), dated Jun. 23, 1995.
"A Hybrid Wafer–Dicing Process of GaAs MMIC Production" (Chang et al.), IEEE Transactions on Semiconductor Manufacturing, vol. 4, No. 1, Feb. 1991.

* cited by examiner

*Primary Examiner*—Charles Bowers
*Assistant Examiner*—Keith Christianson
(74) *Attorney, Agent, or Firm*—Herbert L. Lerner; Laurence A. Greenberg; Werner H. Stemer

(57) ABSTRACT

A semiconductor wafer, after having been provided with a multiplicity of optoelectronic semiconductor structures, is severed into a number of individual chips by abrasive cutting. After cutting, the chip flanks are etched with the chip surface protected. First, a covering layer is deposited over the entire surface of the semiconductor wafer which is provided with the diode structures. The covering layer is structured in such a manner that the covering layer is removed at the areas defined as cutting tracks. Then the semiconductor wafer is cut into individual chips by abrasive cutting with a cutting tool. The cutting tool is guided along the cutting tracks by appropriately moving the semiconductor wafer and the cutting tool relative to one another.

7 Claims, 1 Drawing Sheet

METHOD OF SEVERING A SEMICONDUCTOR WAFER

CROSS-REFERENCE TO RELATED APPLICATION

This is a continuation of copending International Application PCT/DE97/01756, filed Aug. 14, 1997, which designated the United States.

BACKGROUND OF THE INVENTION

1. Field of the Invention

The invention lies in the semiconductor art. Specifically, the invention relates to a method for severing, i.e. cutting, a semiconductor wafer which is provided with a multiplicity of optoelectronic semiconductor structures into a multiplicity of individual chips by abrasive cutting, with a cutting tool. The cutting tool and the semiconductor wafer are guided, relative to one another, along cutting tracks.

Depending on the chip size and wafer size, semiconductor wafers may contain a large number of individual chips which have to be cut or separated before mounting. Nowadays, the cutting method which is almost always used for integrated circuits is sawing, or more precisely abrasive cutting. That process results in far and away the most accurate and clean chip edges and, unlike scoring or breaking methods, provides good results irrespective of the crystal orientation of the semiconductor wafer. The principle of the abrasive cutting method is based on the semiconductor wafer being secured to a table which can be displaced in the X-direction and being passed beneath a diamond abrasive wheel which rotates at high speed. It is necessary to produce side edges of the individual chips which are as clean as possible in order not to impair the electronic and optical properties of the diode structures after the abrasive cutting process has been carried out.

Particularly in the context of semiconductor wafers with a III–V semiconductor base material, the chip flanks produced after separation by abrasive cutting are usually subjected to wet-chemical etching in order to remove the crystal damage produced during abrasive cutting. This is necessary in particular in the case of light-emitting diodes, in order, on the one hand, to improve the light extraction (luminant efficiency) and, on the other hand, to avoid crystal flaws which are induced in operation owing to the damage caused during cutting and which reduce the service life of the light-emitting diode. To prevent the semiconductor surfaces with the partial structured front contact metallization also being etched during the chip flank etching, this surface has to be protected.

Hitherto, the damage to the diode structures caused during severing by abrasive cutting has been reduced by providing a protective layer of photoresist over the entire surface of the semiconductor wafer before separation. That layer must be at least sufficiently thick for the front metallization to be covered even at the edges. However, the layer of protective photoresist must also be cut during separation. As a result, the chip spaces of the diamond abrasive tools used to carry out the abrasive cutting process become partly blocked. Particularly in the case of the III–V materials GaAlAs and InP, this resulted in a quality of abrasive cut which was considerably worse than that achieved with a semiconductor surface without a photoresist layer to be cut through.

2. Summary of the Invention

It is accordingly an object of the invention to provide a method of dividing a semiconductor wafer which is provided with a multiplicity of optoelectronic semiconductor component structures, in particular diode structures, into a number of individual chips by abrasive cutting with a cutting tool, which overcomes the above-mentioned disadvantages of the heretofore-known methods of this general type and which avoids the impairment and deterioration of the abrasive cutting caused by the front-side covering which is required for the subsequent chip flank etching.

With the foregoing and other objects in view there is provided, in accordance with the invention, a method of severing a semiconductor wafer with a multiplicity of optoelectronic semiconductor structures into a plurality of individual chips, which comprises:

providing a semiconductor wafer with a multiplicity of optoelectronic semiconductor structures;

depositing a covering layer over an entire surface of the semiconductor wafer with the optoelectronic semiconductor structures;

structuring the covering layer and partly removing the covering layer to define cutting tracks;

guiding a cutting tool along the cutting tracks by moving the cutting tool and the semiconductor wafer relative to one another and thereby cutting the semiconductor wafer along the cutting tracks into individual chips;

subsequently etching chip flanks of the chips; and then removing the covering layer.

Due to the fact that the covering layer is removed along the cutting tracks at which the abrasive cutting process is subsequently carried out, the cutting tool does not come into contact with the material of the covering layer during the abrasive cutting. As a result, the abrasive cutting process is not impaired.

Following cutting of the semiconductor wafer, the chip flanks are etched. The chip surface remains thereby protected from attack by the etching agent due to the covering layer.

In accordance with an added feature of the invention, the entire surface of the semiconductor wafer is covered with a photoresist material, and the covering layer is structured by a phototechnical exposure process with a photomask and a subsequent developing process. The deposition over the entire surface and the phototechnical exposure and developing processes of the photoresist may be carried out in accordance with standard semiconductor process steps which are known per se, using a suitably structured photomask.

In accordance with an additional feature of the invention, the large-area covering layer has a thickness of at least 5 $\mu$m. This minimum thickness assures that the front metallization which has been applied to the main surface of the semiconductor wafer is completely covered even at the edges.

In accordance with another feature of the invention, the semiconductor wafer has a III–V semiconductor base material.

The preferred materials are GaAlAs and InP. These materials are particularly suited for the production of light-emitting diodes.

In accordance with a concomitant feature of the invention, therefore, the optoelectronic semiconductor structures are diode structures produced in the semiconductor wafer, and preferably light-emitting diodes.

Other features which are considered as characteristic for the invention are set forth in the appended claims.

Although the invention is illustrated and described herein as embodied in a method for cutting a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
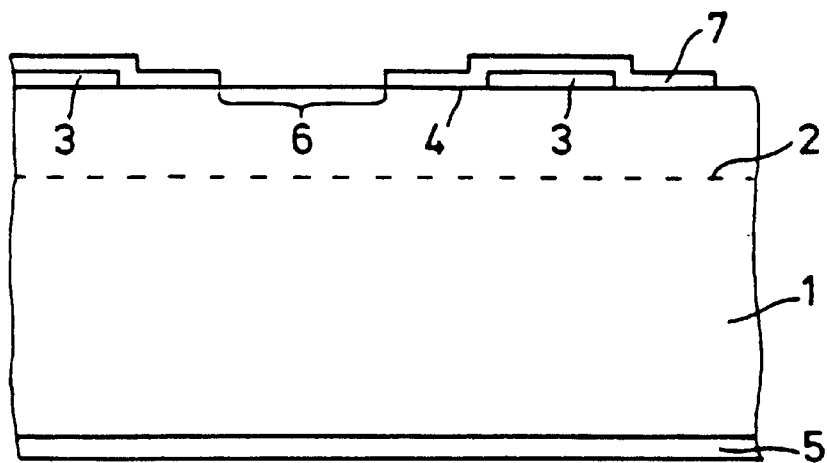
FIG. 1 is a diagrammatic vertical section taken through a semiconductor wafer before severing and separating into the semiconductor chips.

Referring now to the figures of the drawing in detail and first, particularly, to FIG. 1 thereof, there is seen a part of a semiconductor wafer 1 which is provided with a multiplicity of diode structures. The illustration shows the assembly before it is cut into the number of individual chips. The semiconductor wafer 1 comprises a III–V semiconductor basic material, such as in particular GaAlAs or InP, in which light-emitting diodes with a diagrammatically depicted p-n junction 2 are formed. The reference numeral 3 indicates the front metallization formed on the main surface 4 of the semiconductor wafer. The reference numeral 5 denotes a backside metalization or rear metallization which has been deposited on the rear surface of the semiconductor wafer.

The surface area of the main surface 4 of the semiconductor wafer 1 which is denoted by the reference numeral 6 indicates the cutting tracks along which the semiconductor wafer 1 and the cutting tool are guided relative to one another during the subsequent abrasive cutting process. A layer of photoresist 7 is deposited over the entire main surface 4 of the semiconductor wafer 1 which is provided with the diode structures, preferably by a spin coating process. The photoresist layer 7 is subjected to phototechnical exposure in accordance with standard semiconductor methods using a suitably designed photomask, and is then developed and subsequently removed along the cutting tracks 6 at which the abrasive cutting process is to be carried out subsequently.

Figure 2:
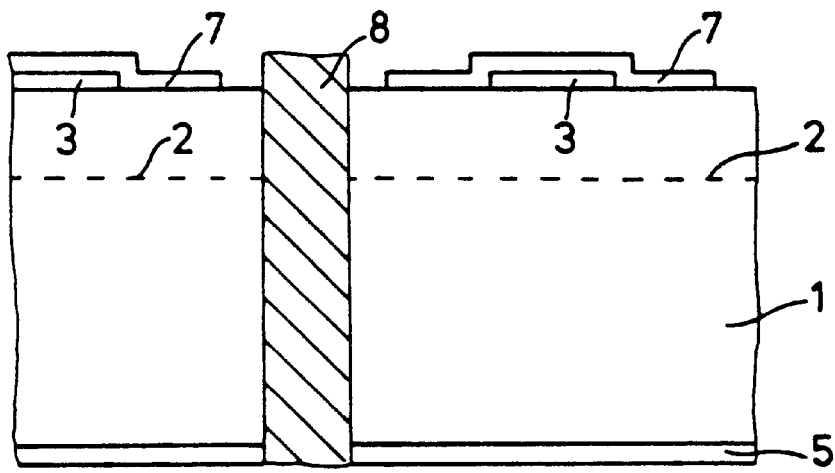
FIG. 2 is a similar view of the semiconductor wafer during the abrasive cutting process with a cutting tool.

FIG. 2 shows the subsequent abrasive cutting process using a diamond abrasive wheel 8 which, as illustrated, is guided along the cutting tracks 6 so as to cut completely through the semiconductor wafer 1. It can be clearly seen from FIG. 2 that the diamond abrasive wheel 8 does not come into contact with the layer of photoresist 7 during the abrasive cutting process. The result of the abrasive cutting is therefore not impaired.

Figure 3:
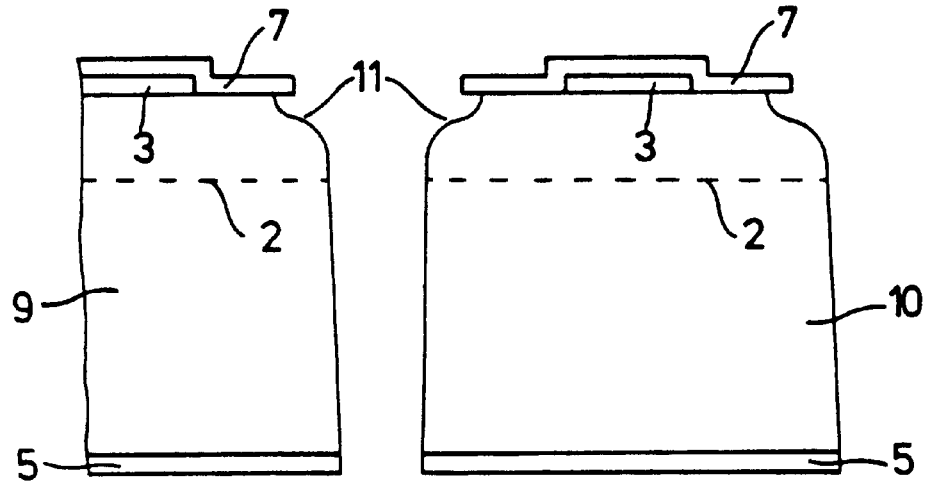
FIG. 3 is a similar diagrammatic section through the assembly after severing and chip flank etching.

Finally, FIG. 3 shows the individual semiconductor chips 9 and 10 after the abrasive cutting process has been carried out and the chip flanks 11 have then been etched.

We claim:

1. A method of severing a semiconductor wafer with a multiplicity of optoelectronic semiconductor structures into a plurality of individual chips, which comprises:

providing a semiconductor wafer with a multiplicity of optoelectronic semiconductor structures;

depositing a covering layer of photoresist material over an entire surface of the semiconductor wafer with the optoelectronic semiconductor structures;

structuring the covering layer and partly removing the covering layer to define cutting tracks;

guiding an abrasive cutting tool along the cutting tracks by moving the cutting tool and the semiconductor wafer relative to one another and thereby cutting the semiconductor wafer along the cutting tracks into individual chips; subsequently etching chip flanks of the chips; and removing the covering layer.

2. The method according to claim 1, wherein the structuring step comprises structuring the covering layer by a phototechnical exposure process with a photomask and a subsequent developing process.

3. The method according to claim 1, wherein the depositing step comprises covering the entire surface of the semiconductor wafer at a thickness of at least substantially 5 $\mu$m.

4. The method according to claim 1, wherein the providing step comprises providing a semiconductor wafer with a III–V semiconductor as a base material.

5. The method according to claim 4, wherein the semiconductor wafer has a base material selected from the group consisting of GaAlAs and InP.

6. The method according to claim 1, wherein the optoelectronic semiconductor structures are diode structures produced in the semiconductor wafer.

7. The method according to claim 1, wherein the optoelectronic semiconductor structures are light-emitting diodes.

* * * * *

UNITED STATES PATENT AND TRADEMARK OFFICE
CERTIFICATE OF CORRECTION

PATENT NO. : 6,281,031 B1
DATED : August 28, 2001
INVENTOR(S) : Josef Maurer et al.

It is certified that error appears in the above-identified patent and that said Letters Patent is hereby corrected as shown below:

<u>Title page,</u>
Item [30], should read as follows:
Aug. 14, 1996  (DE) ............... 196 32 815.2

Signed and Sealed this

Fifth Day of March, 2002

Attest:

JAMES E. ROGAN
*Attesting Officer*   *Director of the United States Patent and Trademark Office*